United States Patent [19]

Nakajima

[11] Patent Number: 5,090,284
[45] Date of Patent: Feb. 25, 1992

[54] MECHANISMS FOR DRIVING PUNCH PINS IN PUNCHING APPARATUS

[75] Inventor: Kiyoharu Nakajima, Yokohama, Japan

[73] Assignee: Hitachi Seiko, Ltd, Ebina, Japan

[21] Appl. No.: 452,356

[22] Filed: Dec. 19, 1989

[51] Int. Cl.$^5$ .............................................. B26D 5/08
[52] U.S. Cl. .............................................. 83/577; 83/571; 83/620
[58] Field of Search ................ 83/575, 576, 577, 618, 83/620, 571, 686

[56] References Cited

U.S. PATENT DOCUMENTS

| | | | |
|---|---|---|---|
| 1,128,036 | 2/1915 | Paulero | 83/577 X |
| 3,005,421 | 10/1961 | Lea | 83/577 X |
| 3,064,881 | 11/1962 | Davy et al. | 83/575 X |
| 3,600,999 | 8/1971 | Daniels | 83/686 |
| 3,730,039 | 5/1973 | Fedrigo | 83/575 X |
| 3,821,910 | 7/1974 | Tjaden | 83/577 X |
| 4,799,413 | 1/1989 | Soderqvist | 83/71 |
| 4,821,614 | 4/1989 | Fleet et al. | 83/100 |

FOREIGN PATENT DOCUMENTS

| | | | |
|---|---|---|---|
| 564803 | 10/1958 | Canada | 83/577 |
| 55-91617 | 11/1980 | Japan . | |

Primary Examiner—Frank T. Yost
Assistant Examiner—Eugenia A. Jones
Attorney, Agent, or Firm—Antonelli, Terry, Stout & Kraus

[57] ABSTRACT

In a punching apparatus, a die set supports, in mutual opposition, an upper die part on which a plurality of punch pins upwardly urged by a plurality of springs are axially slidably disposed at predetermined intervals, and a lower die part formed with a plurality of holes opposing the punch pins. A device for driving the punch pins includes a plurality of drive shafts each having at least three shaft portions disposed adjacent to each other, part of the shaft portions being formed of a magnetic material and the remaining part thereof being formed of a non-magnetic material. At least two electromagnetic coils are fitted around the shaft portions of each drive shaft, and a clutch mechanism disposed on one end of each drive shaft separably couples the drive shaft with the punch pin. The driving device greatly reduces the amount of heat generated by the electromagnetic coils to allow the adoption of an air cooling system, and increases punching force to assure positive working. The clutch mechanism includes male and female clutches, both flanged, and a bush sleeve which, upon abutting on an end of the male clutch, forms predetermined clearances between flanges of the male and female clutches. The clutch mechanism securely couples a punch pin with its drive shaft, while compensating for deviation in their axes so as to prevent bending and breakage of punch pins.

1 Claim, 5 Drawing Sheets

FIG. 7
FIG. 8
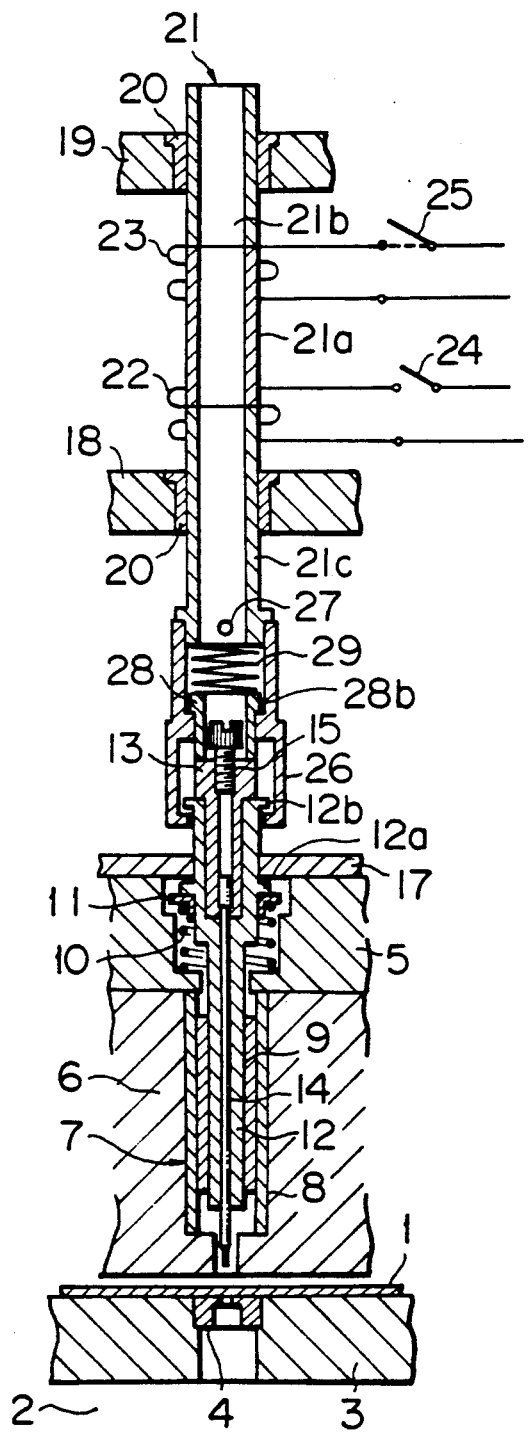
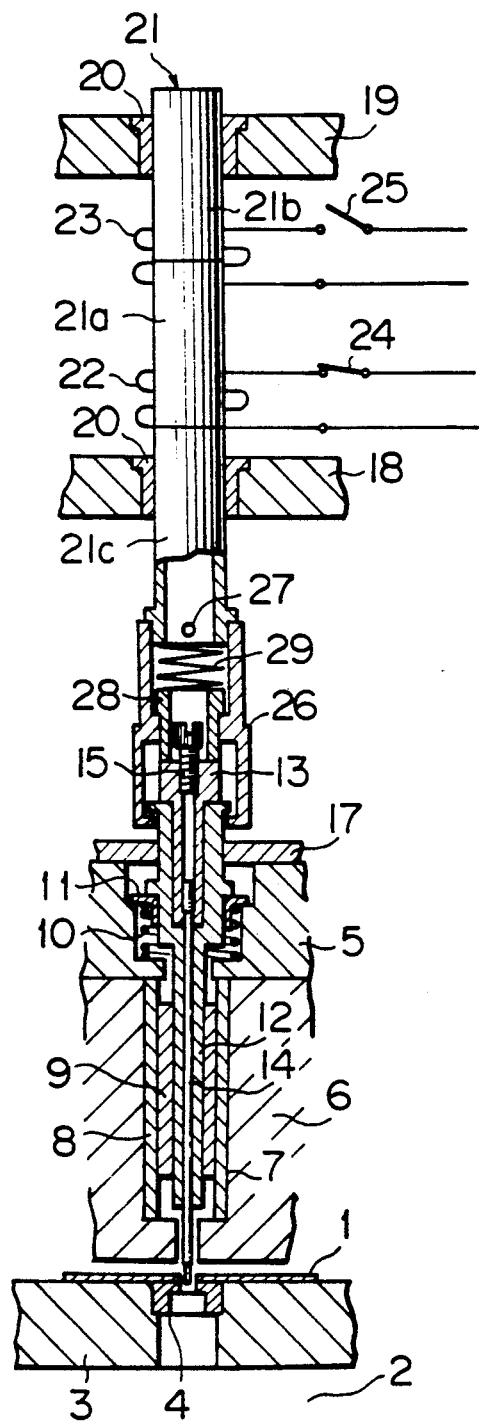

MECHANISMS FOR DRIVING PUNCH PINS IN PUNCHING APPARATUS

BACKGROUND OF THE INVENTION

The present invention relates to mechanisms for driving punch pins in a punching apparatus. More specifically, it relates to a device for driving punch pins in a punching apparatus that punches a ceramic green sheet during the formation of a ceramic substrate, as well as to a clutch mechanism for coupling a punch pin with its drive shaft.

An example of a conventional punching apparatus for forming holes in a ceramic green sheet (hereinafter simply referred to as "a green sheet") is disclosed in Japanese Patent Unexamined Publication No. 55-91617.

In the disclosed apparatus, a plurality of punch pins are supported by an upper plate of a die set, and are disposed at predetermined intervals. A plurality of pairs of solenoids are disposed, each pair corresponding to one of the punch pins. One of the solenoids in each pair is energized so as to move the punch pins to their respective working positions or stand-by positions. Thereafter, the upper plate of the die set, supporting the punch pins, is vertically moved so that the punch pins at their working positions cut holes in a green sheet.

Since the solenoids are always in their state of being energized during operation, they generate a great amount of heat. In order to dissipate heat, cooling is generally effected by adopting a liquid cooling system.

Such a conventional punching apparatus has the following drawbacks. As described before, the punch pins are moved to the working or stand-by positions by electromagnetic force generated by the solenoids. If the electromagnetic force generated by the solenoids is not sufficiently strong, the punch pins may undergo unwanted axial movement during working, resulting in no punching action being performed. On the other hand, if the magnetic force generated by the solenoids is excessively strong, this may result in the solenoids generating heat in such a great amount that the dissipation of heat cannot be performed easily.

The punch pins are connected to the solenoids for driving the punch pins by magnets. If the attractive force of the magnets is not sufficiently strong, in the event that any of the punch pins becomes caught by, e.g., a portion of a separation plate capable of being inserted, the punch pin may become separated from the magnet to remain at a descent position. With the above-described arrangement, therefore, the behavior of the punch pins can be irregular.

On the other hand, if the attractive force of the magnets is excessively strong, in the event that the axis of a punch pin is deviated from that of the magnet by, for instance, the difference in thermal expansion between the proximal portion and the separation plate, the punch pin may become bent, thereby involving the risk of its breakage.

SUMMARY OF THE INVENTION

The present invention has been accomplished in view of the above-described circumstances.

An object of the present invention is to provide a device for driving punch pins in a punching apparatus that is capable of attaining adequate working force, while being capable of achieving a reduction in the amount of heat generated therein.

Another object of the present invention is to provide a structure of clutch mechanisms of a punching apparatus that is capable of securely coupling punch pins with solenoids, while being capable of compensating for deviation in axis between the punch pins and the solenoids due, for instance, to thermal expansion.

In order to achieve the above-stated first object, one aspect of the present invention provides a device for driving punch pins in a punching apparatus. The apparatus includes a die set (denoted at 50 in FIGS. 1 and 2 among the accompanying drawings which illustrate an embodiment of this aspect). The die set supports dies 4 as well as punch pins 14 upwardly urged by springs 10, in such a manner that the dies and the punch pins mutually oppose. A punch pin driving device 51 includes a plurality of drive shafts 21, each drive shaft having two shaft portions 21a and 21'a formed of a magnetic material and disposed with a predetermined space therebetween. Magnetic coils 22, 22' and 23 are disposed on each drive shaft in such a manner as to be able to correspond with the shaft portions 21a and 21'a. A female clutch 26 is disposed on one end of each drive shaft, and it separably couples the drive shaft 21 with the punch pin 14.

Before working starts, the punch pins 14 and the drive shafts 21 are raised at their stand-by positions by the upwardly urging force of the springs 10.

During working, the electromagnetic coils 22 and 22' are energized so as to descend the drive shafts 21. The tip portions of the punch pins 14 are inserted into the dies 4.

When the working is completed, the supply of power to the electromagnetic coils 22 and 22' is stopped. Instead, the electromagnetic coils 23 are energized. The punch pins 14 and the drive shafts 21 are returned to their stand-by positions by an upwardly pulling force generated by the electromagnetic coils 23 and the upwardly urging force of the springs 10. Thereafter, the supply of power to the electromagnetic coils 23 is stopped.

The above-described actions are repeated to perform working. Since working is performed utilizing electromagnetic force generated by two electromagnetic coils 22 and 22' on each drive shaft 21, a large working force can be obtained. Furthermore, since the period, during which the electromagnetic coils 22, 22' and 23 are energized, is short, the amount of heat generated by these electromagnetic coils can be reduced.

In order to achieve the above-stated second object, another aspect of the present invention provides a clutch mechanism for separably coupling a punch pin of a punching apparatus which punches a ceramic green sheet, with a drive shaft of the punch pin. In the clutch mechanism, a punch pin holder (denoted at 12 in FIGS. 3 to 6 illustrating an embodiment of this aspect) holds a punch pin in the axial center thereof. The punch pin holder 12 has axially intermediate and upper flanges 12a and 12b projecting outwardly, and parallel flat surfaces 12c located above the axially intermediate flange 12a. The part of the punch pin holder 12 which is above the flange 12a serves as a male clutch 16.

The clutch mechanism further includes a female clutch 26 joined to one end of a drive shaft 21 and disposed in opposition to the male clutch 16. The female clutch 26 has a main body 26a, first and second flanges 26b and 26c projecting inwardly at axially different positions of the main body 26a, and an opening 26d axially extending from the second flange 26c. A bush sleeve 28 is slidably supported by the female clutch 26.

In order to bring the male clutch 16 into engagement with the female clutch 26, first, the male clutch 16 is inserted into the opening 26d of the female clutch 26. Thereafter, the female clutch 26 is rotated through 90 degrees, thereby establishing engagement between the male and female clutches 16 and 26, hence coupling the punch pin holder 12 with the drive shaft 21.

In this state, clearances a, b and c are formed between certain portions of the male and female clutches 16 and 26 so as to compensate for deviation in axis between the drive shaft 21 and the punch pin holder 12.

BRIEF DESCRIPTION OF THE DRAWINGS

FIG. 7 is a front sectional view showing essential parts of a punching appartus incorporating the clutch mechanism; and FIG. 8 is a view corresponding to FIG. 7, showing a state during working.

DESCRIPTION OF THE PREFERRED EMBODIMENTS

An embodiment of a punch pin driving device according to the present invention will be described with reference to FIGS. 1 and 2.

Figure 2:
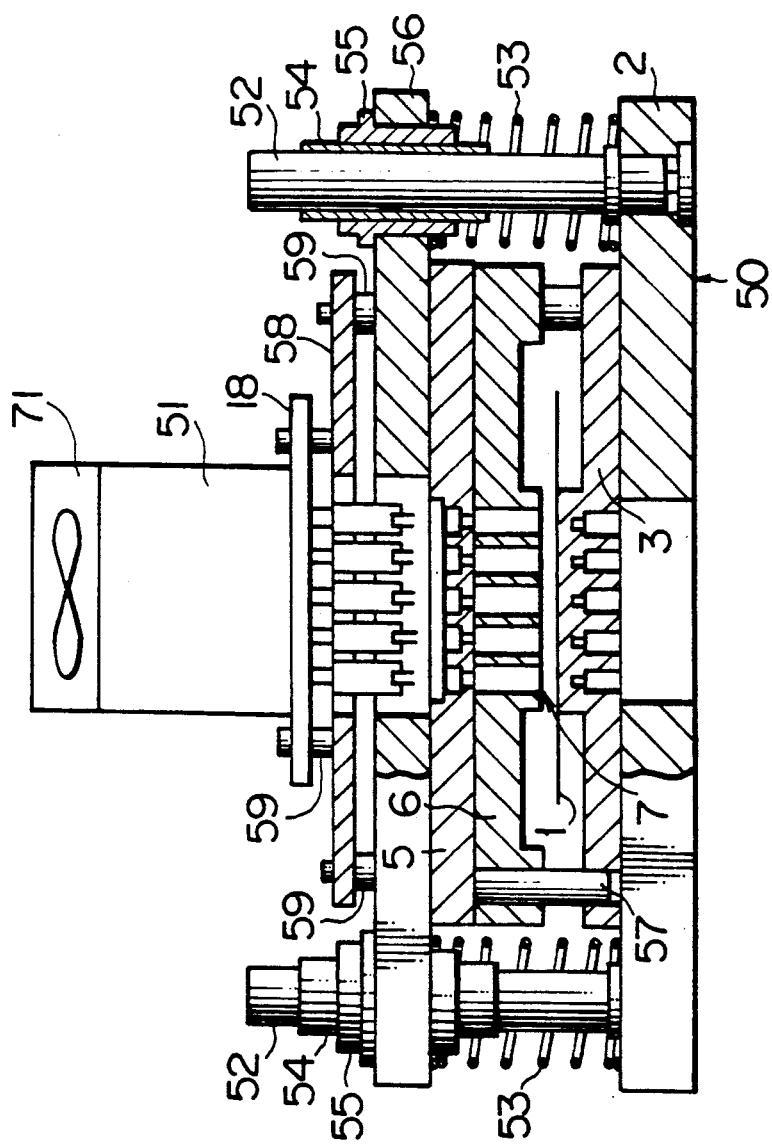
FIG. 2 is a partially sectioned front view of the punching apparatus incorporating the punch pin driving device.

As shown in FIG. 2, a punching apparatus incorporating the punch pin driving device includes a die set 50 having a lower plate 2, guide posts 52 set up on the lower plate 2, springs 53 disposed around the guide posts 52, bearings 54 slidably fitted around the guide posts 52, bushes 55 supported by the bearings 54, and an upper plate 56 attached to and supported by the bushes 55.

A die plate 3 is fixed to the lower plate 2 of the die set 50, and it has a plurality of holes formed therein at predetermined intervals. Dies 4 (shown in FIG. 1) are supported by the die plate 3 and are disposed above these holes.

A base plate 5 is fixed to the upper plate 56 of the die set 50, and a punch plate 6 is in turn fixed to the base plate 5. Punch units 7 are supported by the punch plate 6, and are disposed at predetermined intervals. Each of the punch units 7 has, as shown in FIG. 1, a sleeve 8 inserted in a hole of the punch plate 6, a bearing 9 axially slidably fitted in the sleeve 8, a spring 10 received in a hole formed in the base plate 5, a holder 11 supported by the spring 10, and a punch pin holder 12 having a small-diameter axial portion slidably extending through the bearing 9, a large-diameter axial portion slidably extending through the spring 10 and the holder 11. The large-diameter axial portion of the punch pin holder 12 has flanges 12a and 12b which outwardly project at an axially intermediate position and at the upper end, respectively. The punch pin holder 12 has its intermediate flange 12a kept in contact with the holder 11 so as to be supported by the spring 10. Each punch unit 7 also has a punch pin sleeve 13 force fitted in an upper portion of the punch pin holder 12, a punch pin 14 having a large-diameter axial portion fitted in a hole of the punch pin sleeve 13, a medium-diameter axial portion fitted in a hole of the punch pin holder 12, and a small-diameter cutting blade portion capable of engaging with a hole in the corresponding die 4 to cut a hole in a green sheet 1. The punch unit 7 further has a screw 15 whose axial portion is formed with a thread engageable with a threaded hole formed in an upper end portion of the punch pin sleeve 13, and is capable of abutting the mated end of the large-diameter axial portion of the punch pin 14.

Figure 3:
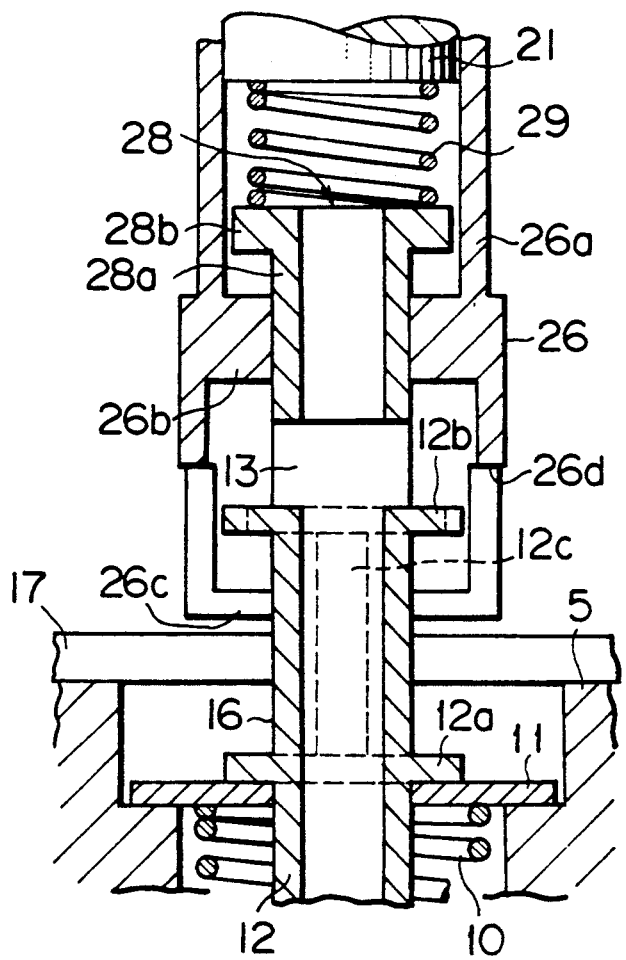
FIG. 3 is a front sectional view of a clutch mechanism according to the present invention, showing a state before the engagement of male and female clutches of the clutch mechanism.
Figure 5:
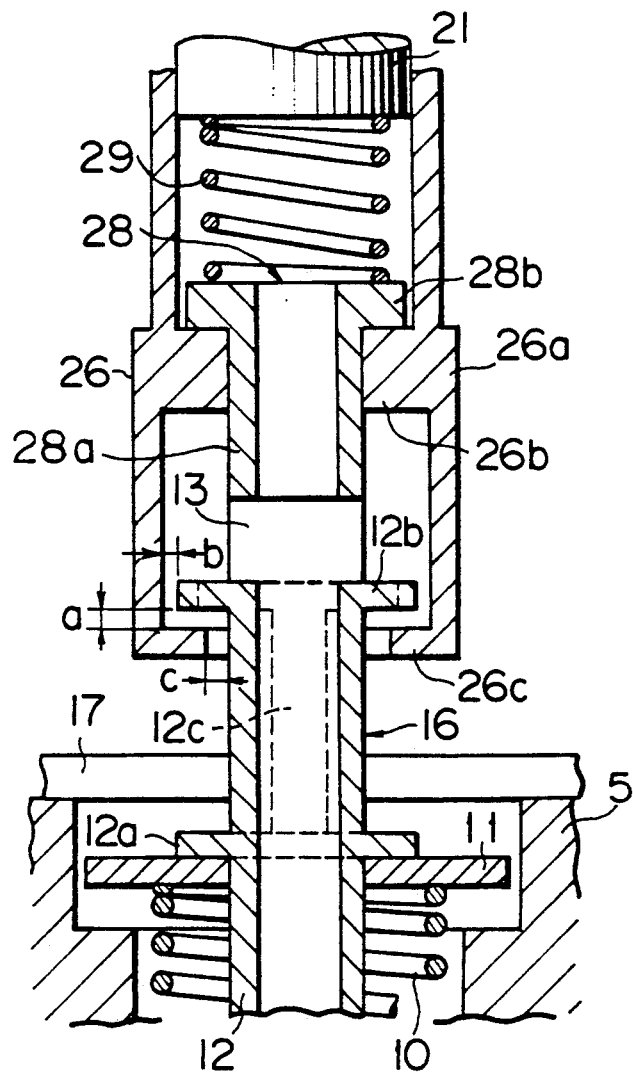
FIG. 5 is a front sectional view corresponding to FIG. 3, showing a state of engagement between the male and female clutches.
Figure 6:
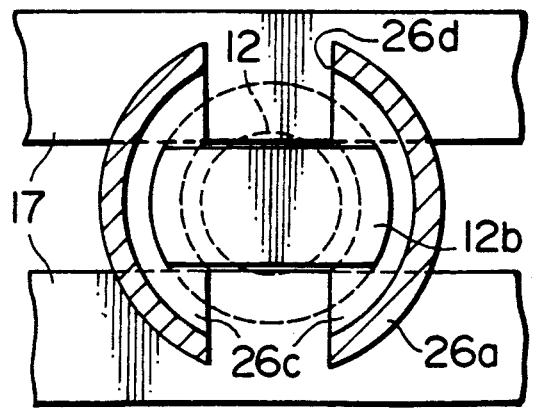
FIG. 6 is a top view of the clutch mechanism in the state shown in FIG. 5, showing the relationship between the male and female clutches.

A certain portion of the punch pin holder 12 which is above the intermediate flange 12a including the upper flange 12b is cut in such a manner as to form mutually parallel flat surfaces 12c (see FIGS. 3 and 5). This portion of the punch pin holder 12 serves as a male clutch 16.

A limitation plate 17 having two parallel parts is fixed to the base plate 5 in such a manner that the parallel parts can contact with the parallel flat surfaces 12c of the male clutch 16. With this construction, the limitation plate 17 acts to limit the rotation of the punch pin holder 12.

Referring to FIG. 2, position determining pins 57 fixed to the punch plate 6 are slidably extended into holes formed in the die plate 3. When the tips of these pins 57 abut on the lower plate 2 through the die plate 3, the pins 57 determine the space between the dies 4 and the punch plate 6.

A mounting plate 58 is fixed to the upper plate 56 of the die set 50 through spacers 59. A punch pin driving device 51 has a base 18 which is fixed to the mounting plate 58 through other spacers 59.

The punch pin driving device 51 has the base 18, guide plates 19a, 19b and 19c disposed in parallel with the base 18 at predetermined intervals, and a plurality of drive shaft assemblies. As shown in FIG. 1, each of the drive shaft assemblies includes bushes 20 coaxially inserted in the guide plate 19a and the base 18, a drive shaft 21 having shaft portions 21a and 21a' formed of a magnetic material as well as shaft portions 21b, 21b' and 21c formed of a non-magnetic material, the shaft portions 21b and 21c slidably passing through the bushes 20. Electromagnetic coils 23, 22 and 22' are loosely fitted around the drive shaft 21 in such a manner as to be able to correspond with the shaft portions 21a and 21a', and are supported by the guide plates 19b and 19c and the base 18. A female clutch 26 has a small-diameter axial portion joined to the lower end of the drive shaft 21, a large-diameter axial portion engageable with the above-described male clutch 16, flanges 26b and 26c inwardly projecting at an axially intermediate position and at the lower end of the female clutch 26, and an opening 26d capable of receiving the flat surfaces 12c of the male clutch 16. A bush sleeve 28 slidably passes through the intermediate flange 26b of the female clutch 26. The bush sleeve 28 has a flange 28b at the upper end which is capable of abutting on the intermediate flange 26b. A spiral groove is formed in a lower end surface of the bush sleeve 28. A spring 29 is disposed between the lower end of the drive shaft 21 and the bush sleeve 28, and is capable of pushing the bush sleeve 28 downwardly.

An operation shaft 60 is fixed to the upper end of the drive shaft 21. An operation groove 61 is formed in the upper end surface of the operation shaft 60, while bores 62 and 63 are formed through an axial portion of the shaft 60 at axially different positions.

A base 64 is fixed to the guide plate 19a through brackets 65.

Detectors 66 and 67, each having mutually opposed light-emitting and light-receiving elements, are fixed to the base 64 in such a manner that each light-emitting element and the associated light-receiving element oppose each other with the operation shaft 60 therebetween.

A controller 68 is connected to the detectors 66 and 67, and is also connected, through drive circuits 69 and 70, to the electromagnetic coils 22, 22' and 23.

A fan 71 is fixed in place above the driving device 51.

A green sheet 1 is supported by an XY table (not shown) located below the die set 50 in such a manner as to be positioned between the die plate 3 and the punch plate 6.

The punching apparatus incorporating the punch pin driving device 51 has the above-described construction. Before the start of working, the mounting plate 58 and the punch pin driving device 51 are mounted on the upper plate 56 of the die set 50. Thereafter, a screwdriver is set in the groove 61 of the operation shaft 60, and the shaft 60 is rotated until the male clutch 16 is inserted in the female clutch 26. With this condition, the operation shaft 60 is lowered to a position at which the bush sleeve 28 abuts on the punch pin sleeve 13, as shown in FIG. 3. Following this, the operation shaft 60 is pushed downwardly while being rotated through 90 degrees, thereby bringing the male clutch 16 into engagement with the female clutch 26, as shown in FIG. 5.

In this state, the punch pin holder 12 and the drive shaft 21 are coupled utilizing the upwardly urging force of the spring 29. Therefore, so long as no external force is applied to the operation shaft 60, the drive shaft 21 does not rotate.

Also, the bores 62 and 63 are oriented to the direction in which they can be detected by the detectors 66 and 67, respectively.

Figure 1:
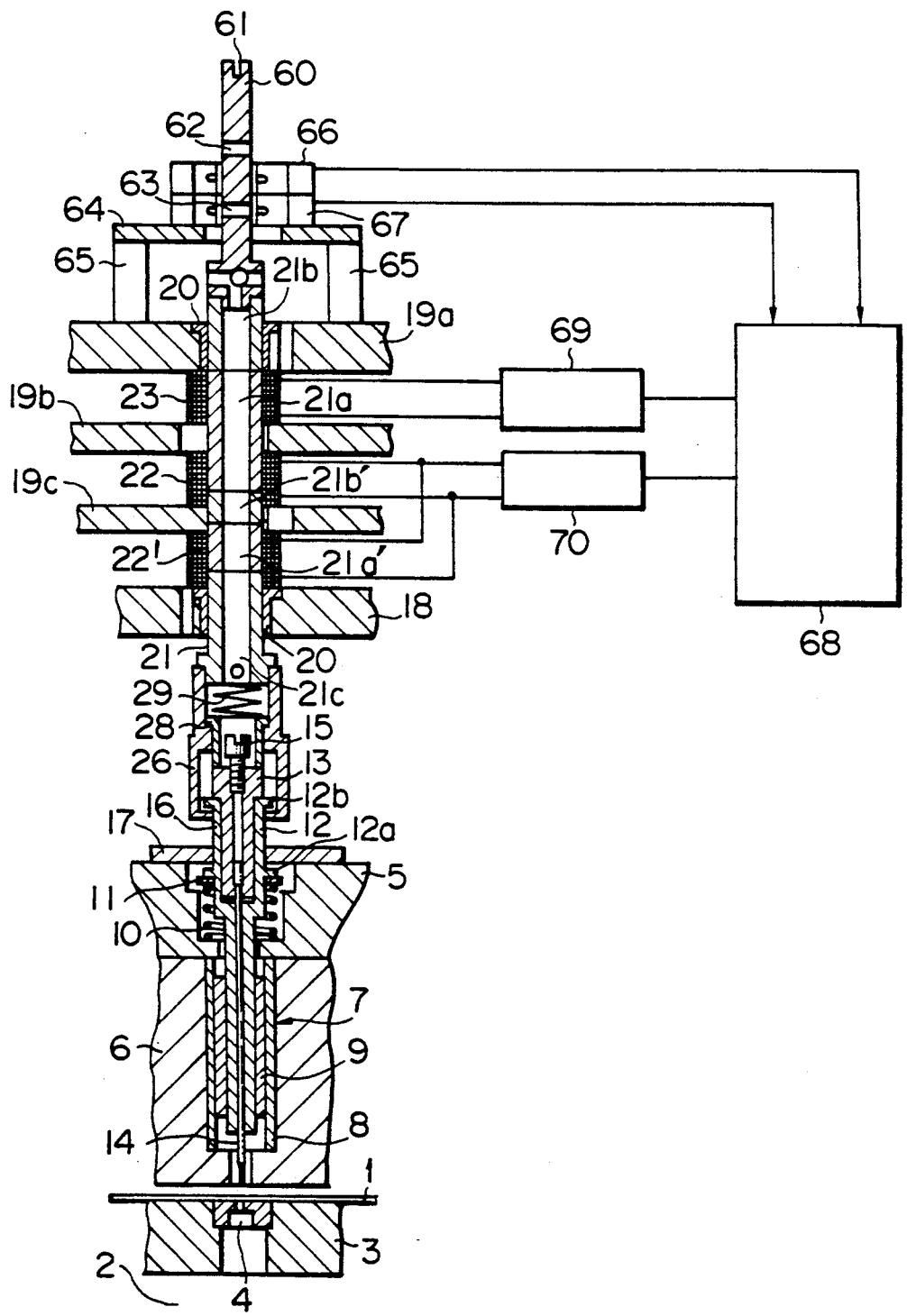
FIG. 1 is a view showing a front section of a device for driving punch pins in a punching apparatus according to the present invention.

Subsequently, the punch pin holder 12, the drive shaft 21, the female clutch 26 and the operation shaft 60 are raised by the spring 10 to a stand-by position at which the bore 63 of the operation shaft 60 faces the detector 67, as shown in FIG. 1, thereby determining the position of these members.

When all the punch pin holders 12 in the punch plate 6 have been coupled to the corresponding drive shafts 21 of the driving device 51, the fan 71 is mounted upon the driving device 51. Then, the die-set 50 and the associated members are set on a working machine (not shown).

A green sheet 1 is fed to a certain extent in such a manner that it is positioned between the die plate 3 and the punch plate 6, while being capable of sliding on the die plate 3, thereby determining position of the green sheet 1. Further, the upper plate 56 of the die set 50 is lowered by a driving means of the working machine until the position determining pins 57 abut on the lower plate 2.

At this time, the gap between the punch plate 6 and the green sheet 1 is set at a value of not more than 1 mm.

Subsequently, the fan 71 is started. This causes air sucked through holes formed in the base 18 of the driving device 51 to be exhausted through holes formed in the guide plates 19a, 19b and 19c, while air sucked through the gaps between the male clutches 16 and the female clutches 26 to form flows passing through the bush sleeves 28, the drive shafts 21 and the operation shafts 60. Thus, the electromagnetic coils 22, 22' and 23, as well as the drive shafts 21 which will receive radiation heat from these electromagnetic coils are cooled.

Thereafter, punching work is entered. The controller 68 gives a command to the drive circuit 70 in such a manner that those electromagnetic coils 22 and 22' corresponding to the punch pins 14 to be operated are energized. Upon the energization of the electromagnetic coils 22 and 22', the associated drive shafts 21 descend against the upwardly urging force of the springs 10, whereby the corresponding punch pins 14 are lowered through the bush sleeves 28 and the punch pin sleeves 13 so as to form holes in the green sheet 1.

When the upper bores 62 of the operation shafts 60 are brought into positions facing the detector 66, and the detector 66 generates a detection signal, the controller 68 supplies a driving termination signal to the drive circuit 70 so that the supply of power to the electromagnetic coils 22 and 22' is stopped. The controller 68 also gives a command to the drive circuit 69 so that the electromagnetic coils 23 are energized.

This energization causes an upwardly pulling force to act on the drive shafts 21. The punch pins 14 and the drive shafts 21 are ascended by this upwardly pulling force and the upwardly urging force of the springs 10.

When the lower bores 63 of the operation shafts 60 are brought into positions facing the detector 67, and the detector 67 generates a detection signal, the controller 68 supplies a driving termination signal to the drive circuit 69 so that the supply of power to the electromagnetic coils 23 is stopped.

Thereafter, the positioning of a green sheet 1, and the vertical movement of drive shafts 21 are repeated, so as to form the necessary holes in the green sheet 1.

In this way, during the formation of holes in a green sheet, those electromagnetic coils 22, 22' and 23 corresponding to the necessary punch pins 14 are energized only for the period of time required to vertically move the punch pins 14. When this arrangement is compared with the conventional arrangement where the electromagnetic coils are kept energized during operation, it enables a great reduction in the amount of heat generated by the electromagnetic coils. This feature allows the electromagnetic coils 22, 22' and 23 to be sufficiently cooled by an air cooling system, thereby making any large cooling system unnecessary.

Furthermore, since punching force is increased, punching can be performed positively.

Next, descriptions will be given of the construction of a clutch mechanism according to the present invention, with reference to FIGS. 3 through 8.

With a view to facilitating the reader's understanding, a punching apparatus incorporating the clutch mechanism has a relatively simple structure which is distinguished in that, as shown in FIGS. 7 and 8, a drive shaft 21 has an axial portion 21a formed of a magnetic material, and axial portions 21b and 21c connected to the upper and lower ends of the axial portion 21a and formed of a non-magnetic material. Electromagnetic coils 22 and 23 are supported by the base 18 in such a manner as to correspond to the axial portion 21a of the drive shaft 21. Switches 24 and 25 are respectively connected to the electromagnetic coils 22 and 23.

The clutch mechanism includes a female clutch 26 joined to the lower end portion of the axial portion 21c by means of a pin 27. The female clutch 26 has a hollow main body 26a, flanges 26b and 26c inwardly projecting at axially intermediate position of the main body 26a and at a lower end of the same, and an opening 26d axially inwardly extending from the flange 26c.

The clutch mechanism also includes a bush sleeve 28 having an axial portion 28a slidably passing through the flange 26b of the female clutch 26, and a flange 28b capable of abutting on the flange 26b.

A spring 29 is interposed between the drive shaft 21 and the bush sleeve 28. The force of the spring 29 is greater than that of the spring 10.

With the above-described construction of the clutch mechanism, the punch pin 14 and the drive shaft 21 are coupled together in the following manner.

Figure 4:
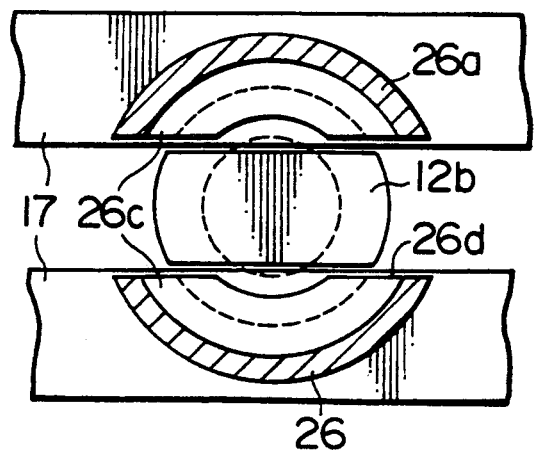
FIG. 4 is a top view of the clutch mechanism in the state shown in FIG. 3, showing the relationship between the male and female clutches.

As shown in FIGS. 3 and 4, the opening 26d of the female clutch 26 is aligned with the male clutch 16. With this condition, the female clutch 26 is lowered until the bush sleeve 28 abuts on the punch pin sleeve 13. When the female clutch 26 is further lowered down, the holder 11, the punch pin holder 12 and the punch pin sleeve 13 descend as the spring 10 is being compressed. When the holder 11 abuts on an intermediate stepped portion of the base plate 5, the spring 29 is compressed to allow the female clutch 26 to further descend to a predetermined position.

When the female clutch 26 has descended to the predetermined position, the female clutch 26 is rotated through 90 degrees, and is then released from lowering force. At this time, the urging force of the spring 29 causes the rise of the female clutch 26 until the flange 26b of the female clutch 26 abuts on the flange 28b of the bush sleeve 28. Further, the urging force of the spring 10 causes the rise of the holder 11, the punch pin holder 12 and the punch pin sleeve 13, which in turn causes the rise of the bush sleeve 28 and the female clutch 26. This results in the achievement of the condition shown in FIGS. 5, 6 and 7.

At this time, the flange 12b of the male clutch 16 and the flange 26c of the female clutch 26 axially opposes each other with a certain clearance therebetween.

When the punch pin 14 is coupled to the drive shaft 21, the electromagnetic coil 22 is energized, and the drive shaft 21 is descended. This descent causes the bush sleeve 28 to push the punch pin holder 12 downwardly, resulting in the cutting blade portion of the punch pin 14 projecting from the punch plate 6, as shown in FIG. 8. In this condition, punching of a green sheet 1 is performed.

When the punching is completed, the electromagnetic coil 23 is energized, and the drive shaft 21 is ascended. This ascent causes the female clutch 26 to ascend in unison, while the upwardly urging force of the spring 10 causes the punch pin holder 12 to rise, thereby returning the cutting blade portion of the punch pin 14 into the punch plate 6.

During this rising, in the event that the punch pin 14 becomes caught with a force stronger than the upwardly urging force of the spring 10, the flange 26c of the female clutch 26 is able to come into contact with the flange 12b of the male clutch 16, so as to raise the punch pin holder 12. Thus, the punch pin 14 can be positively raised even in this event.

With the above-described clutch mechanism, therefore, it is possible to secure proper action of the punch pin 14.

Furthermore, since the clearances b and c oriented in different directions are provided between the male clutch 16 and the female clutch 26, it is possible to compensate for deviation in axis between a punch unit 7 and the drive shaft 21 resulting from, for instance, insufficient precision with which these members are manufactured, or difference in thermal expansion. The provision of the axial clearance a between the flange 12b and the flange 26c enables the urging force of the spring 10 alone to act as the pressure with which the punch pin sleeve 13 is kept in contact with the bush sleeve 28. Therefore, the pressure of contact between these members is relatively small, thereby facilitating the compensation for deviation due to thermal expansion or the like.

With the above-described compensation, it is possible to prevent the punch pin 14 from receiving any bending force, thereby avoiding such troubles as breakage of the punch pin 14.

As has been described above, the punch pin driving device in a punching apparatus according to the present invention is capable of achieving a great reduction in the amount of heat generated by the electromagnetic coils. This feature allows an air cooling system to be adopted to effect cooling. Another advantage of the punch pin driving device is that punching force is increased, thereby enabling positive working.

The clutch mechanism according to the present invention is capable of securely coupling a punch pin and its drive shaft, while compensating for any deviation in axis therebetween. With the clutch mechanism, therefore, it is possible to prevent bending or breakage of the punch pin.

What is claimed is:

1. A device for driving punch pins in a punching apparatus including a plurality of punch pins upwardly urged by a plurality of springs; an upper die part on which said punch pins are axially slidably disposed at predetermined intervals; a lower die part formed with a plurality of holes opposing said punch pins; and a die set supporting said upper die part and said lower die part in such a manner that said upper and lower die parts mutually are opposed to each other, said device for driving said punch pins comprising a plurality of drive shaft assemblies each including:

a drive shaft having two shaft portions formed of a magnetic material and the shaft portions formed of a non-magnetic material, said magnetic and non-magnetic shaft portions being disposed adjacent to each other, three electromagnetic coils fitted around said magnetic shaft portions, control means for energizing two of said electromagnetic coils at the same time so as to advance said drive shaft and said punch pin to perform a punching operation and for energizing the remaining one of said electromagnetic coils while at the same time stopping the energization of said two electromagnetic coils so as to return said drive shaft and said punch pin when the punching operation is completed, and a clutch mechanism being disposed on one end of the drive shaft and capable of coupling and separating the drive shaft with and from the punch pin.

* * * * *